United States Patent
Ueno (10) Patent No.: US 9,437,724 B2
(45) Date of Patent: Sep. 6, 2016

(54) SEMICONDUCTOR DEVICE AND METHOD OF MANUFACTURING THE SEMICONDUCTOR DEVICE

(71) Applicant: Panasonic Intellectual Property Management Co., Ltd., Osaka (JP)

(72) Inventor: Hiroaki Ueno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/680,050

(22) Filed: Apr. 6, 2015

(65) Prior Publication Data

US 2015/0303290 A1    Oct. 22, 2015

(30) Foreign Application Priority Data

Apr. 21, 2014 (JP) .................. 2014-087640

(51) Int. Cl.
*H01L 29/66* (2006.01)
*H01L 29/778* (2006.01)
*H01L 29/20* (2006.01)
*H01L 29/423* (2006.01)
*H01L 29/43* (2006.01)
(Continued)

(52) U.S. Cl.
CPC ....... *H01L 29/7781* (2013.01); *H01L 29/7786* (2013.01); *H01L 29/1066* (2013.01); *H01L 29/1075* (2013.01); *H01L 29/2003* (2013.01); *H01L 29/42356* (2013.01); *H01L 29/432* (2013.01); *H03K 2017/6875* (2013.01); *H03K 2217/0036* (2013.01)

(58) Field of Classification Search
CPC ............. H01L 29/2003; H01L 29/205; H01L 29/66431; H01L 29/778
USPC .......................................... 257/192, 194, 195
See application file for complete search history.

(56) References Cited

U.S. PATENT DOCUMENTS

| 5,355,005 A | * | 10/1994 | Tehrani | ............... H01L 27/0605 241/293 |
| 6,940,090 B2 | * | 9/2005 | Saito | .................... H01L 27/0605 257/197 |
| 7,268,375 B2 | * | 9/2007 | Shur | .................... H01L 29/7783 257/194 |

(Continued)

FOREIGN PATENT DOCUMENTS

| JP | 2003-228320 | 8/2003 |
| JP | 2004-273486 | 9/2004 |
| JP | 2012-151256 | 8/2012 |

*Primary Examiner* — Jay C Kim
(74) *Attorney, Agent, or Firm* — McDermott Will & Emery LLP (57) ABSTRACT

A semiconductor device comprises a substrate, a semiconductor multilayer structure supported by the substrate, and a first nitride transistor provided in a first area of the semiconductor multilayer structure. The semiconductor multilayer structure comprises first to fourth nitride semiconductor layers. The first nitride transistor comprises part of the first nitride semiconductor layer, part of the second nitride semiconductor layer, part of the third nitride semiconductor layer, part of the fourth nitride semiconductor layer, a first gate electrode electrically connected to the part of the first nitride semiconductor layer, a first source electrode electrically connected to one of two portions in the third nitride semiconductor layer, a first drain electrode electrically connected to the other one of the two portions, and a first substrate electrode electrically connected to the part of the fourth nitride semiconductor layer.

5 Claims, 8 Drawing Sheets

(51) Int. Cl.
*H01L 29/10* (2006.01)
*H03K 17/687* (2006.01)

(56) References Cited

U.S. PATENT DOCUMENTS

| | | | |
|---|---|---|---|
| 7,385,230 B1 * | 6/2008 | Taylor | H01L 27/0605 257/107 |
| 7,638,818 B2 * | 12/2009 | Wu | H01L 29/207 257/192 |
| 8,575,658 B2 * | 11/2013 | Tamari | H01L 21/8252 257/195 |
| 8,698,202 B2 * | 4/2014 | Mitsunaga | H01L 27/0605 257/192 |
| 8,716,141 B2 * | 5/2014 | Dora | H01L 29/1608 438/640 |
| 8,829,568 B2 * | 9/2014 | Ueno | H01L 21/743 257/168 |
| 9,171,730 B2 * | 10/2015 | Chowdhury | H01L 21/283 |
| 2010/0065923 A1 * | 3/2010 | Charles | H01L 29/2003 257/402 |
| 2011/0062448 A1 * | 3/2011 | Hong | H01L 29/42316 257/76 |

* cited by examiner

| INPUT | 0V | 3V |
|---|---|---|
| TRANSISTOR 101 | ON | OFF |
| TRANSISTOR 102 | OFF | ON |
| OUTPUT | 3V | 0V |

SEMICONDUCTOR DEVICE AND METHOD OF MANUFACTURING THE SEMICONDUCTOR DEVICE

BACKGROUND

1. Technical Field

The present disclosure relates to semiconductor devices that use nitride semiconductors such as gallium nitride.

2. Description of the Related Art

In recent years, active researches have been conducted on field effect transistors (FETs) that use nitride semiconductors, such as gallium nitride (GaN), as high-frequency high-power devices. Since GaN can form various mixed crystals with aluminum nitride (AlN) and indium nitride (InN), such a nitride semiconductor can form a heterojunction like arsenic semiconductors such as gallium arsenide (GaAs). However, even if the nitride semiconductor is not doped with impurities, highly concentrated carriers are generated by spontaneous polarization or piezo polarization at a heterojunction interface. Accordingly, an FET formed of the nitride semiconductor is likely to become a depletion-mode (normally-on) device, and it is difficult to obtain a characteristic of an enhancement-mode (normally-off) device (see, for example, Unexamined Japanese Patent Publication No. 2004-273486).

On the other hand, most devices currently used in a power electronics field are normally-off devices. Accordingly, an FET using a normally-off nitride semiconductor is strongly required in the power electronics field.

Examples of known structures of the normally-off FET using the nitride semiconductor include a structure with a simply decreased thickness or a simply decreased Al composition ratio of an aluminum gallium nitride (AlGaN) layer that serves as a barrier layer in an AlGaN/GaN heterojunction. The examples also include a structure in which a threshold voltage is shifted to a positive voltage by a dig of a gate section, and a structure in which a polarization electric field is not generated in a crystal growth direction of a nitride semiconductor by production of an FET on a (10-12) plane of a sapphire substrate.

A junction field effect transistor (JFET) that uses a p-type GaN layer for a gate is proposed (see, for example, Unexamined Japanese Patent Publication No. 2003-228320). The JFET uses, for a gate, a pn junction having built-in potential that is higher than built-in potential of a Schottky junction. This brings about an advantage that a rising voltage of the gate can be increased, and that a gate leakage current can be limited to a small level even if a positive gate voltage is applied.

Recently, efforts have been made to achieve high speed, low power consumption, space saving, and elimination of parasitic components in gate driver circuits, by production of power devices and gate driver circuits for switching power devices using these nitride semiconductors for integration into one chip as a power IC.

Unexamined Japanese Patent Publication No. 2012-151256 discloses a semiconductor apparatus that includes a first conductivity type field effect transistor and a second conductivity type field effect transistor on a semiconductor substrate.

SUMMARY

The present inventor has found that conventional techniques fail to stabilize an output of a transistor.

One non-limiting and exemplary embodiment provides a semiconductor device including: a substrate; a semiconductor multilayer structure supported by the substrate; and a first nitride transistor provided in a first area of the semiconductor multilayer structure. The semiconductor multilayer structure includes: a first nitride semiconductor layer; a second nitride semiconductor layer; a third nitride semiconductor layer having a band gap narrower than a band gap of the second nitride semiconductor layer; and a fourth nitride semiconductor layer having an electric resistance value larger than an electric resistance value of the third nitride semiconductor layer. The first nitride semiconductor layer is located between the substrate and the second nitride semiconductor layer, the third nitride semiconductor layer is located between the second nitride semiconductor layer and the fourth nitride semiconductor layer, and the second nitride semiconductor layer and the third nitride semiconductor layer are located between the first nitride semiconductor layer and the fourth nitride semiconductor layer. The first nitride transistor includes, in the first area of the semiconductor multilayer structure: parts of the first to fourth nitride semiconductor layers; a first gate electrode; a first source electrode; a first drain electrode; and a first substrate electrode. The first gate electrode is electrically connected to the part of the first nitride semiconductor layer. The first source is electrode electrically connected to one of two portions in the third nitride semiconductor layer. The first drain electrode is electrically connected to the other one of the two portions. The two portions are spaced by a predetermined distance. The first substrate electrode is electrically connected to the part of the fourth nitride semiconductor layer.

It should be noted that general or specific embodiments may be implemented as an element, a device, a method, or any selective combination thereof.

The present disclosure allows an output of a transistor to be stabilized.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 9:
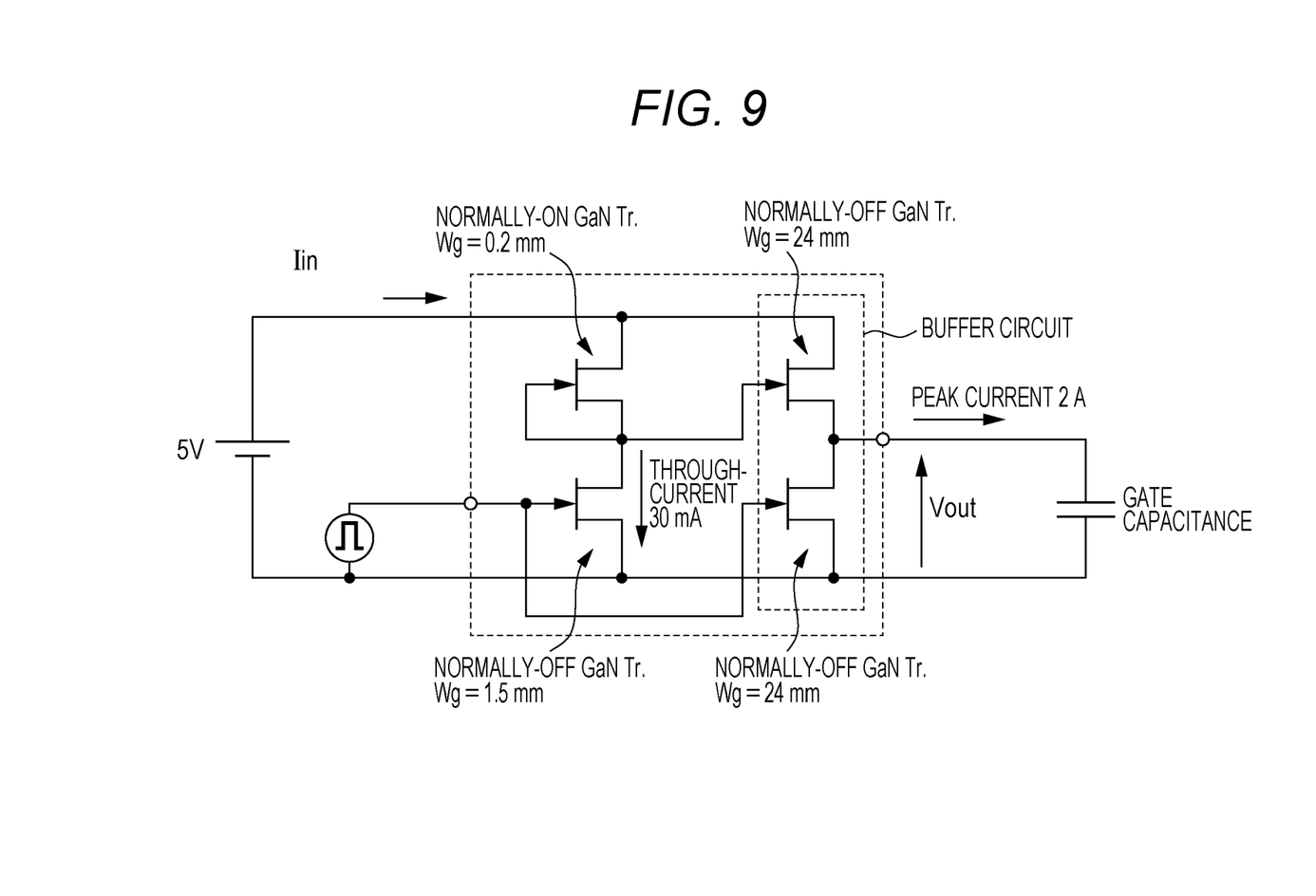
FIG. 9 is a circuit diagram illustrating a super buffer circuit formed of nitride transistors.

First, a viewpoint of the present inventor will be described. A super buffer circuit as illustrated in FIG. 9 may be used for a logic reversing part of a gate driver circuit formed of nitride semiconductors. The super buffer circuit includes only n-channel transistors, and uses normally-on transistors in part for a reason of a circuit configuration. This causes a problem that a through-current of the order of about 10 mA flows through the super buffer circuit during standby, leading to high power consumption. Therefore, integration of a power device and the gate driver circuit into one chip to produce an IC using nitride semiconductors fails to achieve sufficient reduction in power consumption.

Meanwhile, there is a problem that, when the gate driver circuit is formed using nitride semiconductors, it is difficult to form a first nitride transistor and, for example, a second nitride transistor that has a conductivity type opposite to a conductivity type of the first nitride transistor, on a common substrate. There is another problem that, even when a first conductivity type field effect transistor and a second conductivity type field effect transistor are provided on a common semiconductor substrate, outputs of the transistors cannot be stabilized.

In view of these problems, the present inventor has found out that the gate driver circuit can be implemented through formation of an n-channel nitride transistor and a p-channel nitride transistor on a common substrate, and through combination of these transistors for complementary operation. One aspect of an exemplary embodiment of the present disclosure allows minimization of standby power consumption of the logic reversing part of the gate driver circuit formed of nitride semiconductors. This allows implementation of the gate driver circuit with higher speed and less power consumption than conventional circuits for power transistors formed of nitride semiconductors. This also allows integration of the gate driver circuit together with the power device formed of nitride semiconductors into one-chip IC, and allows space saving and elimination of parasitic components.

An outline of one aspect of the present disclosure is as follows.

A semiconductor device according to one aspect of the present disclosure includes: a substrate; a semiconductor multilayer structure supported by the substrate; and a first nitride transistor provided in a first area of the semiconductor multilayer structure. The semiconductor multilayer structure includes: a first nitride semiconductor layer; a second nitride semiconductor layer; a third nitride semiconductor layer having a band gap narrower than a band gap of the second nitride semiconductor layer; and a fourth nitride semiconductor layer having an electric resistance value larger than an electric resistance value of the third nitride semiconductor layer. The first nitride semiconductor layer is located between the substrate and the second nitride semiconductor layer. The third nitride semiconductor layer is located between the second nitride semiconductor layer and the fourth nitride semiconductor layer. The second nitride semiconductor layer and the third nitride semiconductor layer are located between the first nitride semiconductor layer and the fourth nitride semiconductor layer. The first nitride transistor includes, in the first area of the semiconductor multilayer structure, part of the first nitride semiconductor layer, part of the second nitride semiconductor layer, part of the third nitride semiconductor layer, and part of the fourth nitride semiconductor layer. The first nitride transistor further includes a first gate electrode electrically connected to the part of the first nitride semiconductor layer; a first substrate electrode electrically connected to the part of the fourth nitride semiconductor layer; and a first source electrode electrically connected to one of two portions in the third nitride semiconductor layer, and a first drain electrode electrically connected to the other one of the two portions, the two portions being spaced by a predetermined distance. Accordingly, the first nitride transistor includes a bottom-gate JFET structure using a heterojunction between the third nitride semiconductor layer and the second nitride semiconductor layer, using the first nitride semiconductor layer as the gate, and using a vicinity of an interface between the third nitride semiconductor layer and the second nitride semiconductor layer as a channel. Therefore, it is possible to further include, on a common substrate, the second nitride transistor that has a top-gate JFET structure using the third nitride semiconductor layer as the gate, and using the vicinity of the interface between the second nitride semiconductor layer and the first nitride semiconductor layer as the channel. That is, it is possible to easily form the first nitride transistor and, for example, the second nitride transistor that has the conductivity type opposite to the conductivity type of the first nitride transistor, on a common substrate.

The semiconductor multilayer structure may further include a semi-insulating nitride semiconductor layer located between the substrate and the first nitride semiconductor layer. The first nitride semiconductor layer may have an electric resistance value that is smaller than an electric resistance value of the semi-insulating nitride semiconductor layer. This allows, when the second nitride transistor is further provided on the common substrate, the first nitride transistor to be electrically isolated from the second nitride transistor.

The semiconductor device may further include a second nitride transistor provided in a second area different from the first area in the semiconductor multilayer structure. The second nitride transistor may include, in the second area of the semiconductor multilayer structure part of the first nitride semiconductor layer, part of the second nitride semiconductor layer, part of the third nitride semiconductor layer, and part of the semi-insulating nitride semiconductor layer. The second nitride transistor may further include: a second substrate electrode electrically connected to the part of the semi-insulating nitride semiconductor layer; a second source electrode and a second drain electrode electrically connected to two respective portions in the first nitride semiconductor layer, the two portions being spaced by a predetermined distance; and a second gate electrode electrically connected to the part of the third nitride semiconductor layer. The second nitride semiconductor layer may have a band gap wider than a band gap of the first nitride semiconductor layer. This makes it possible to implement, on a common substrate, the semiconductor device including the first nitride transistor using the vicinity of the interface between the third nitride semiconductor layer and the second nitride semiconductor layer as the channel, and the second nitride transistor using the vicinity of the interface between the first nitride semiconductor layer and the second nitride semiconductor layer as the channel.

The first area may be isolated from the second area by an element isolation structure in the semiconductor multilayer structure. This allows the second nitride transistor to be electrically isolated from the first nitride transistor more securely.

The first nitride semiconductor layer and the third nitride semiconductor layer may have conductivity types opposite to each other. This allows a pair of transistors to be provided on a common substrate; one of the first nitride transistor and the second nitride transistor is a p-type transistor, and the other one is an n-type transistor. Therefore, a logic inverter circuit can be constituted using the semiconductor device.

An interface between the first nitride semiconductor layer and the second nitride semiconductor layer, and an interface between the second nitride semiconductor layer and the third nitride semiconductor layer may be each depleted, when no voltage is applied to the first and second gate electrodes in the first nitride transistor and the second nitride transistor. This allows normally-off first nitride transistor and second nitride transistor to be implemented.

A method of manufacturing a semiconductor device according to one aspect of the present disclosure involves: a step (A) of forming a semiconductor multilayer structure on a substrate, the semiconductor multilayer structure including: a first nitride semiconductor layer; a second nitride semiconductor layer; a third nitride semiconductor layer having a band gap narrower than a band gap of the second nitride semiconductor layer; and a fourth nitride semiconductor layer having an electric resistance value larger than an electric resistance value of the third nitride semiconductor layer, wherein the first nitride semiconductor layer is located between the substrate and the second nitride semiconductor layer, the third nitride semiconductor layer is located between the second nitride semiconductor layer and the fourth nitride semiconductor layer, and the second nitride semiconductor layer and the third nitride semiconductor layer are located between the first nitride semiconductor layer and the fourth nitride semiconductor layer; a step (B) of removing part of a first area of the semiconductor multilayer structure by etching, and exposing a surface of the first nitride semiconductor layer and two portions of the third nitride semiconductor layer, the two portions being spaced by a predetermined distance; and a step (C) of forming a first gate electrode electrically connected to the exposed surface of the first nitride semiconductor layer, a first source electrode electrically connected to one of the exposed two portions of the third nitride semiconductor layer, a first drain electrode electrically connected to the other one of the exposed two portions of the third nitride semiconductor layer, and a first substrate electrode electrically connected to part of the fourth nitride semiconductor layer. The method provides, by the steps (A) to (C), the semiconductor device including a first nitride transistor located in the first area of the semiconductor multilayer structure, the first nitride transistor including: part of the first nitride semiconductor layer; part of the second nitride semiconductor layer; part of the third nitride semiconductor layer; the part of the fourth nitride semiconductor layer; the first gate electrodes each electrically connected to the part of the first nitride semiconductor layer; the first source electrode electrically connected to the one of the two portions of the third nitride semiconductor layer; the first drain electrode electrically connected to the other one of the two portions; and the first substrate electrode electrically connected to the part of the fourth nitride semiconductor layer. This allows manufacture of the above-described semiconductor device.

The semiconductor multilayer structure may further include a semi-insulating nitride semiconductor layer located between the substrate and the first nitride semiconductor layer, and the first nitride semiconductor layer may have an electric resistance value that is smaller than an electric resistance value of the semi-insulating nitride semiconductor layer.

The step (B) may include a step of removing part of a second area of the semiconductor multilayer structure by etching, and exposing a surface of the semi-insulating nitride semiconductor layer, two portions of the first nitride semiconductor layer, the two portions being spaced by a predetermined distance, and a surface of the third nitride semiconductor layer, the step (C) may include a step of forming second substrate electrode electrically connected to the exposed surface of the semi-insulating nitride semiconductor layer, a second source electrode electrically connected to one of the exposed two portions of the first nitride semiconductor layer, a second drain electrode electrically connected to the other one of the exposed two portions of the first nitride semiconductor layer, and a second gate electrode electrically connected to the exposed surface of the third nitride semiconductor layer. The second nitride semiconductor layer may have the band gap wider than the band gap of the first nitride semiconductor layer. The steps (B) and (C) allow formation of a second nitride transistor located in the second area of the semiconductor multilayer structure, the second nitride transistor including: part of the first nitride semiconductor layer; part of the second nitride semiconductor layer; part of the third nitride semiconductor layer; part of the semi-insulating nitride semiconductor layer; second substrate electrode electrically connected to the part of the semi-insulating nitride semiconductor layer; the second source electrode electrically connected to the one of the two portions of the first nitride semiconductor layer, the two portions being spaced by a predetermined distance; the second drain electrode electrically connected to the other one of the two portions; and the second gate electrode electrically connected to the part of the third nitride semiconductor layer.

The step (B) may further include a step of forming an element isolation structure configured to isolate the first area from the second area in the semiconductor multilayer structure.

The first nitride semiconductor layer and the third nitride semiconductor layer may have conductivity types opposite to each other.

First Exemplary Embodiment

Figure 1A:
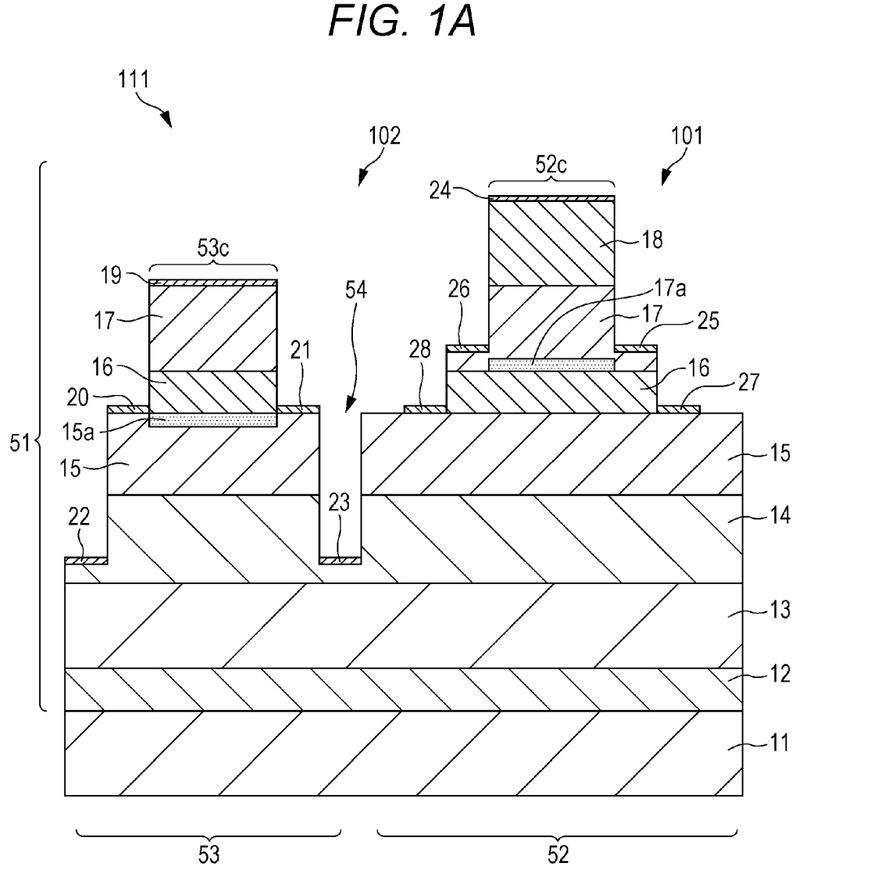
FIG. 1A is a cross-sectional view illustrating a semiconductor device according to a first exemplary embodiment of the present disclosure.

A first exemplary embodiment of a semiconductor device according to the present disclosure will be described below with reference to the drawings. FIG. 1A illustrates a schematic cross-sectional structure of semiconductor device 111 according to the first exemplary embodiment of the present disclosure. Semiconductor device 111 includes substrate 11, semiconductor multilayer structure 51 supported by substrate 11, first nitride transistor 101 provided in first area 52 of semiconductor multilayer structure 51, and second nitride transistor 102 provided in second area 53 different from first area 52. A nitride semiconductor herein refers to a semiconducting material represented by composition formulas $Al_x In_y Ga_z N$, $0 \leq x < 1$, $0 \leq y < 1$, $0 < z \leq 1$, and $x+y+z=1$.

Substrate 11 is formed of, for example, a silicon (Si) substrate having a plane direction (111) of a principal plane.

Semiconductor multilayer structure 51 includes at least first nitride semiconductor layer 15, second nitride semiconductor layer 16, third nitride semiconductor layer 17, and fourth nitride semiconductor layer 18. In semiconductor multilayer structure 51, first nitride semiconductor layer 15 is located on a side nearest to substrate 11. Second nitride semiconductor layer 16 and third nitride semiconductor layer 17 are sandwiched and located between first nitride semiconductor layer 15 and fourth nitride semiconductor layer 18. Second nitride semiconductor layer 16 is located on a first nitride semiconductor layer 15 side. Third nitride semiconductor layer 17 is located on a fourth nitride semiconductor layer 18 side.

First nitride semiconductor layer 15 has a first conductivity type. For example, first nitride semiconductor layer 15 is an n-type GaN layer having a thickness of 200 nm, and having a concentration of activated Si, which is an n-type dopant, of $1 \times 10^{16}$ cm$^{-3}$.

Second nitride semiconductor layer 16 has no doped impurities, and has a band gap wider than a band gap of first nitride semiconductor layer 15. For example, second nitride semiconductor layer 16 is an $Al_{0.22}Ga_{0.78}N$ layer having no doped impurities, and having a thickness of 22 nm.

Third nitride semiconductor layer 17 has a second conductivity type. That is, third nitride semiconductor layer 17 has the conductivity type opposite to the conductivity type of first nitride semiconductor layer 15. In addition, third nitride semiconductor layer 17 has a band gap narrower than a band gap of second nitride semiconductor layer 16. For example, third nitride semiconductor layer 17 is a p-type GaN layer having a thickness of 200 nm, and having a concentration of activated magnesium (Mg), which is a p-type dopant, of $1 \times 10^{16}$ cm$^{-3}$.

Mixed crystal ratios and impurity concentrations of first nitride semiconductor layer 15, second nitride semiconductor layer 16, and third nitride semiconductor layer 17, and thicknesses of second nitride semiconductor layer 16 and third nitride semiconductor layer 17 are determined so that an area that serves as a channel in first nitride semiconductor layer 15 or third nitride semiconductor layer 17 is depleted while no voltage is applied to the gate electrodes of first nitride transistor 101 and second nitride transistor 102.

Fourth nitride semiconductor layer 18 is a semi-insulating layer and has an electric resistance value larger than an electric resistance value of third nitride semiconductor layer 17. Fourth nitride semiconductor layer 18 is, for example, a GaN layer having doped carbon (C) of a concentration of $1 \times 10^{19}$ cm$^{-3}$, and having a thickness of 200 nm.

Semiconductor multilayer structure 51 may include another semiconductor layer in addition to the semiconductor layers described above. According to the present exemplary embodiment, semiconductor multilayer structure 51 further includes semi-insulating nitride semiconductor layer 14 located between substrate 11 and first nitride semiconductor layer 15, in order to secure electrical insulation between first nitride transistor 101 and second nitride transistor 102. Semi-insulating nitride semiconductor layer 14 is a GaN layer having doped carbon of a concentration of $1 \times 10^{19}$ cm$^{-3}$, and having a thickness of 200 nm. In addition, semiconductor multilayer structure 51 includes buffer layer 12 and superlattice layer 13 located between substrate 11 and semi-insulating nitride semiconductor layer 14. Buffer layer 12 is, for example, an AlN layer having no doped impurities and having a thickness of 50 nm. Superlattice layer 13 includes, for example, a plurality of GaN layers each having a thickness of 5 nm and a plurality of $Al_{0.05}Ga_{0.95}N$ layers each having a thickness of 5 nm, the GaN layers and $Al_{0.05}Ga_{0.95}N$ layers having no doped impurities and being alternately laminated. Superlattice layer 13 is, for example, 3 µm thick. These semiconductor layers are, for example, laminated by epitaxial growth having a principal plane of a Ga plane.

As long as semiconductor multilayer structure 51 described above can be formed, a material and plane direction of substrate 11 are not limited to the exemplified material and plane direction. As long as the semiconductor layers above semi-insulating nitride semiconductor layer 14 can be laminated with good crystallinity, there is particularly no limitation on the material and thickness of buffer layer 12 and superlattice layer 13. Impurities for forming semi-insulating nitride semiconductor layers are not limited to carbon.

In order to electrically isolate first area 52 from second area 53 of semiconductor multilayer structure 51, element isolation structure 54 is provided in semiconductor multilayer structure 51. According to the present exemplary embodiment, element isolation structure 54 is, for example, a mesa structure in which a recess is provided in semiconductor multilayer structure 51 so that the recess reaches semi-insulating nitride semiconductor layer 14 from a fourth nitride semiconductor layer 18 side. Element isolation may be performed by implantation of impurities or formation of oxidized layers.

First nitride transistor 101 includes, in first area 52 of semiconductor multilayer structure 51, part of first nitride semiconductor layer 15, part of second nitride semiconductor layer 16, part of third nitride semiconductor layer 17, and part of fourth nitride semiconductor layer 18. As will be described in detail below, first nitride transistor 101 is a p-channel heterojunction JFET. First nitride semiconductor layer 15 functions as a gate, and a vicinity of an interface between second nitride semiconductor layer 16 and third nitride semiconductor layer 17 functions as a channel. For this purpose, first nitride semiconductor layer 15 and third nitride semiconductor layer 17 are provided with electrodes.

Specifically, a ridge structure is formed in first area 52 in which side surfaces of the ridge structure sandwich main part 52c including first nitride semiconductor layer 15, second nitride semiconductor layer 16, third nitride semiconductor layer 17, and fourth nitride semiconductor layer 18. Part of third nitride semiconductor layer 17 and part of first nitride semiconductor layer 15 are exposed on both sides of the ridge structure.

A pair of first gate electrodes 27 and 28 that sandwich the ridge structure are electrically connected to exposed surfaces of first nitride semiconductor layer 15. In addition, first source electrode 25 and first drain electrode 26 are electrically connected to exposed surfaces of third nitride semiconductor layer 17, the surfaces being spaced by a predetermined distance by the ridge structure. In addition, first substrate electrode 24 is further provided on a surface of fourth nitride semiconductor layer 18 that is a top of the ridge structure.

First substrate electrode 24, and first gate electrodes 27 and 28 each have a multilayer structure of Ti (titanium) layer and Al layer. First source electrode 25 and first drain electrode 26 each have a Ni (nickel) layer. Each of these electrodes has ohmic contact with the corresponding nitride semiconductor layer. Electrode materials described above are exemplary, and another electrode material may be used as long as a good ohmic characteristic is obtained.

Second nitride transistor 102 includes, in second area 53 of semiconductor multilayer structure 51, part of semi-insulating nitride semiconductor layer 14, part of first nitride semiconductor layer 15, part of second nitride semiconductor layer 16, and part of third nitride semiconductor layer 17. As will be described in detail below, second nitride transistor 102 is an n-channel heterojunction JFET. Third nitride semiconductor layer 17 functions as a gate, and a vicinity of an interface between second nitride semiconductor layer 16 and first nitride semiconductor layer 15 functions as a channel. For this purpose, first nitride semiconductor layer 15 and third nitride semiconductor layer 17 are provided with electrodes.

Specifically, a ridge structure is formed in second area 53 in which side surfaces of the ridge structure sandwich main part 53c including semi-insulating nitride semiconductor layer 14, first nitride semiconductor layer 15, second nitride semiconductor layer 16, and third nitride semiconductor layer 17. Part of first nitride semiconductor layer 15 and part of semi-insulating nitride semiconductor layer 14 are exposed on both sides of the ridge structure. Fourth nitride semiconductor layer 18 is removed, and third nitride semiconductor layer 17 is exposed on a top of the ridge.

A pair of second substrate electrodes 22 and 23 that sandwich the ridge structure are electrically connected to exposed surfaces of semi-insulating nitride semiconductor layer 14. In addition, second source electrode 20 and second drain electrode 21 are electrically connected to exposed surfaces of first nitride semiconductor layer 15, the surfaces being spaced by a predetermined distance by the ridge structure. In addition, second gate electrode 19 is further provided on a surface of third nitride semiconductor layer 17 that is a top of the ridge structure.

Second substrate electrodes 22 and 23, and second source electrode 20 and second drain electrode 21 each have a multilayer structure of Ti layer and Al layer. Second gate electrode 19 has a Ni layer. Each of these electrodes has ohmic contact with the corresponding nitride semiconductor layer. Electrode materials described above are exemplary, and another electrode material may be used as long as a good ohmic characteristic is obtained.

First gate electrodes 27 and 28 of first nitride transistor 101, and second gate electrode 19 of second nitride transistor 102 are electrically connected by unillustrated interconnection. First drain electrode 26 of first nitride transistor 101 and second drain electrode 21 of second nitride transistor 102 are electrically connected by unillustrated interconnection. First source electrode 25 and first substrate electrode 24 of first nitride transistor 101 are electrically connected by unillustrated interconnection. Second source electrode 20 and second substrate electrodes 22 and 23 of second nitride transistor 102 are electrically connected by unillustrated interconnection.

Next, an operation of semiconductor device 111 will be described.

Figure 1B:
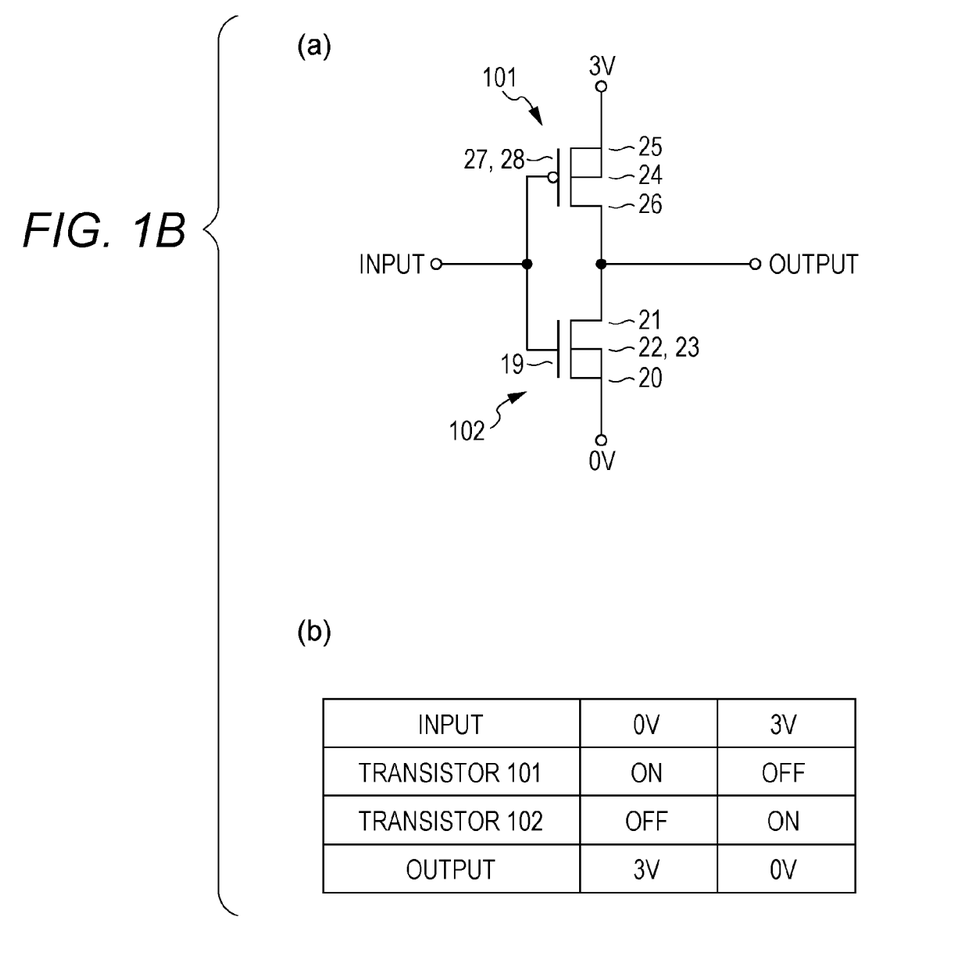
FIG. 1B shows a circuit diagram for constituting a complementary transistor using the semiconductor device according to the first exemplary embodiment of the present disclosure, and a table illustrating an operation of the transistor.

First nitride transistor 101 and second nitride transistor 102 of semiconductor device 111 are connected, for example, to constitute a logic inverter circuit, as illustrated in FIG. 1B (a).

In the logic inverter circuit illustrated in (a) part of FIG. 1B, when no voltage is applied to any electrodes, second nitride semiconductor layer 16 and p-type third nitride semiconductor layer 17 form a heterojunction, and third nitride semiconductor layer 17 has a band gap narrower than a band gap of second nitride semiconductor layer 16 in first nitride transistor 101. Accordingly, a two-dimensional hole gas is formed in a vicinity of an interface between second nitride semiconductor layer 16 and third nitride semiconductor layer 17. However, since third nitride semiconductor layer 17 and first nitride semiconductor layer 15 form a pn junction with undoped second nitride semiconductor layer 16 sandwiched between third nitride semiconductor layer 17 and first nitride semiconductor layer 15, depletion layer 17a is formed in a vicinity of an interface between third nitride semiconductor layer 17 and second nitride semiconductor layer 16. Thus, carriers (i.e. holes) do not exist in the vicinity of the interface between third nitride semiconductor layer 17 and second nitride semiconductor layer 16. Therefore, first nitride transistor 101, through which no current flows, is in a normally-off state.

In the logic inverter circuit illustrated in (a) part of FIG. 1B, when no voltage is applied to any electrodes, n-type first nitride semiconductor layer 15 and second nitride semiconductor layer 16 form a heterojunction, and first nitride semiconductor layer 15 has a band gap narrower than a band gap of second nitride semiconductor layer 16 in second nitride transistor 102. Accordingly, a two-dimensional electron gas is formed in a vicinity of an interface between first nitride semiconductor layer 15 and second nitride semiconductor layer 16. However, since third nitride semiconductor layer 17 and first nitride semiconductor layer 15 form a pn junction with undoped second nitride semiconductor layer 16 sandwiched between third nitride semiconductor layer 17 and first nitride semiconductor layer 15, depletion layer 15a is formed in a vicinity of an interface between first nitride semiconductor layer 15 and second nitride semiconductor layer 16. Thus, carriers (i.e. electrons) do not exist in the vicinity of the interface between first nitride semiconductor layer 15 and second nitride semiconductor layer 16. Therefore, second nitride transistor 102, through which no current flows, is also in a normally-off state.

Next, in the logic inverter circuit illustrated in (a) part of FIG. 1B, second source electrode 20 is grounded. A supply voltage, for example 3 V, which is applied to first source electrode 25, is larger than an absolute value of a threshold voltage of second nitride transistor 102 and a threshold voltage of first nitride transistor 101. Second gate electrode 19 and first gate electrodes 27 and 28, which constitute an input terminal, are grounded.

In this state, in second nitride transistor 102, a gate-source voltage becomes 0 V, an n-type channel is closed, and high resistance is obtained. Conversely, in first nitride transistor 101, the gate-source voltage becomes −3 V, a p-type channel is opened, and low resistance is obtained. This results in that potential becomes 3 V at an output terminal to which first drain electrode 26 and second drain electrode 21 are connected.

When 3 V, which is identical to the supply voltage, is applied to second gate electrode 19 and first gate electrodes 27 and 28 that constitute the input terminal, in second nitride transistor 102, the gate-source voltage becomes 3 V, the n-type channel is opened, and low resistance is obtained. Conversely, in first nitride transistor 101, the gate-source voltage becomes 0 V, the p-type channel is closed, and high resistance is obtained. This results in that the potential becomes 0 V at the output terminal to which first drain electrode 26 and second drain electrode 21 are connected.

Figure 2:
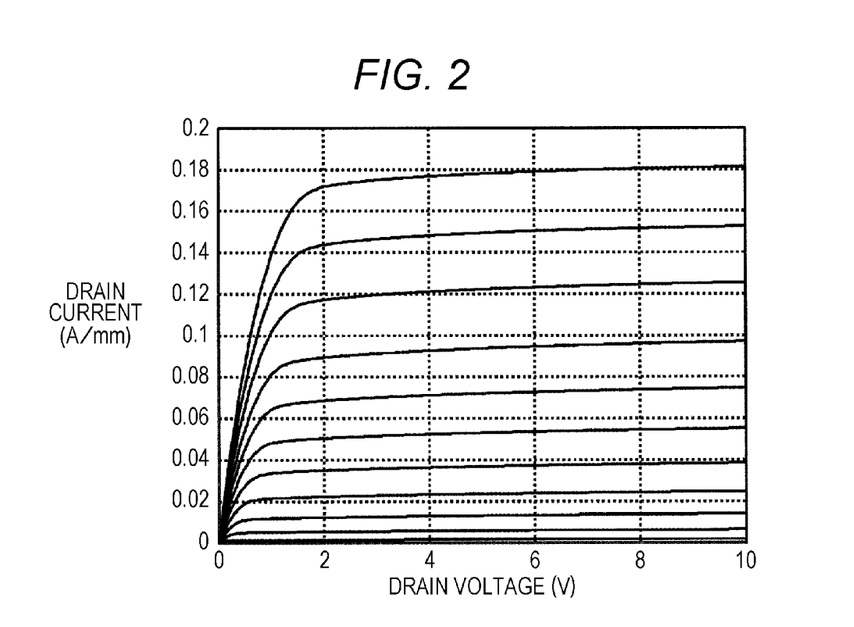
FIG. 2 is a graph illustrating drain-source voltage versus drain-source current characteristic curves in an n-channel nitride transistor according to the first exemplary embodiment of the present disclosure.
Figure 3:
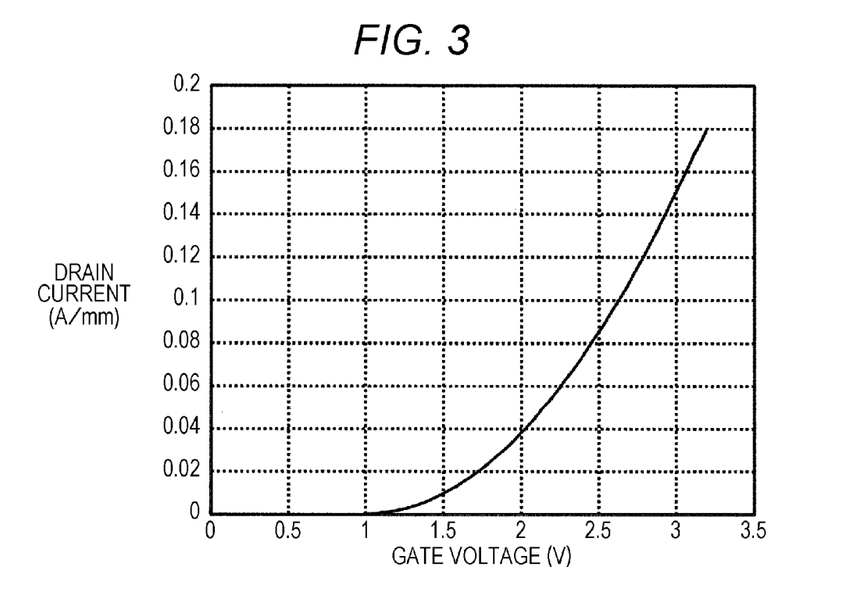
FIG. 3 is a graph illustrating a gate-source voltage versus drain-source current characteristic curve in the n-channel nitride transistor according to the first exemplary embodiment of the present disclosure, in which the drain-source voltage is 10 V.
Figure 4:
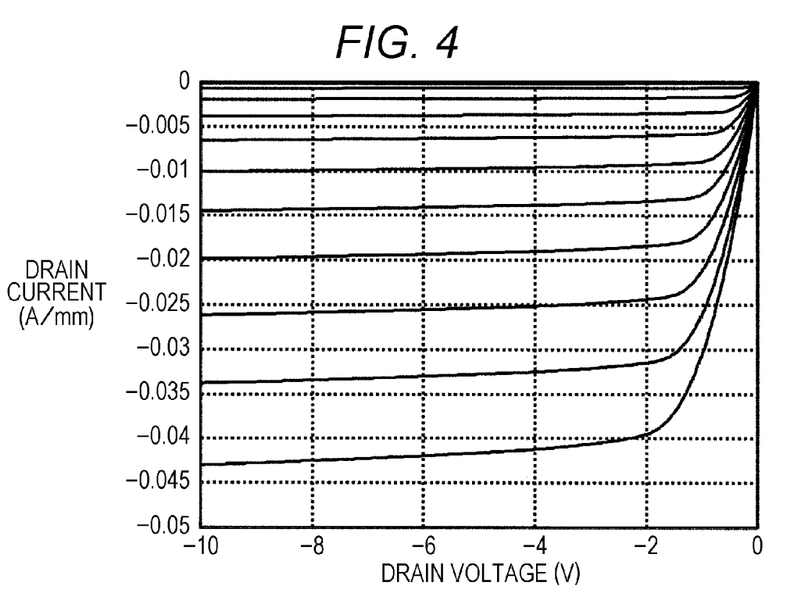
FIG. 4 is a graph illustrating drain-source voltage versus drain-source current characteristic curves in a p-channel nitride transistor according to the first exemplary embodiment of the present disclosure.
Figure 5:
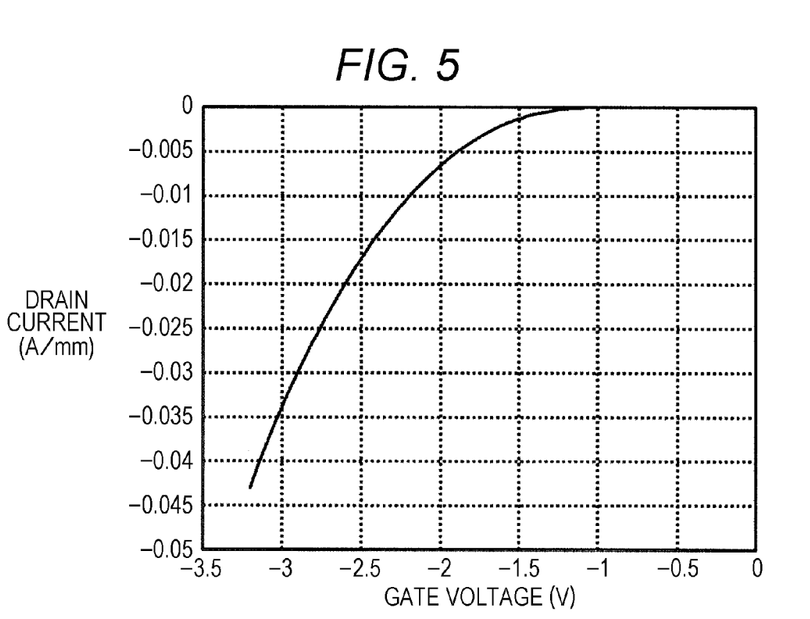
FIG. 5 is a graph illustrating a gate-source voltage versus drain-source current characteristic curve in the p-channel nitride transistor according to the first exemplary embodiment of the present disclosure, in which the drain-source voltage is −10 V.

FIG. 2 illustrates drain-source voltage versus drain-source current characteristic curves for second nitride transistor 102 according to the first exemplary embodiment. In FIG. 2, the curve having the largest current value shows the characteristic when the gate-source voltage is 3.2 V, and the other curves show the characteristics in which the gate-source voltage decreases by 0.2 V as the current value decreases. FIG. 3 illustrates a gate-source voltage versus drain-source current characteristic curve also for second nitride transistor 102. FIG. 4 illustrates drain-source voltage versus drain-source current characteristic curves for first nitride transistor 101. In FIG. 4, the curve having the largest absolute value of current shows the characteristic when the gate-source voltage is −3.2 V, and the other curves show the characteristics in which the gate-source voltage decreases by −0.2 V as the absolute value of current decreases. FIG. 5 illustrates a gate-source voltage versus drain-source current characteristic curves also for first nitride transistor 101.

These diagrams show that both second nitride transistor 102 and first nitride transistor 101 operate in a normally-off state.

The absolute values of the threshold voltages are also almost equal to each other. When the applied gate-source voltage and the applied drain-source voltage have a common absolute value, a current value through the n-type channel:a current value through the p-type channel=4:1, approximately. Accordingly, in order to uniformize the current values between second nitride transistor 102 and first nitride transistor 101 when the common voltage value is applied, a channel width of second nitride transistor 102 may be a quarter of a channel width of first nitride transistor 101.

Figure 6:
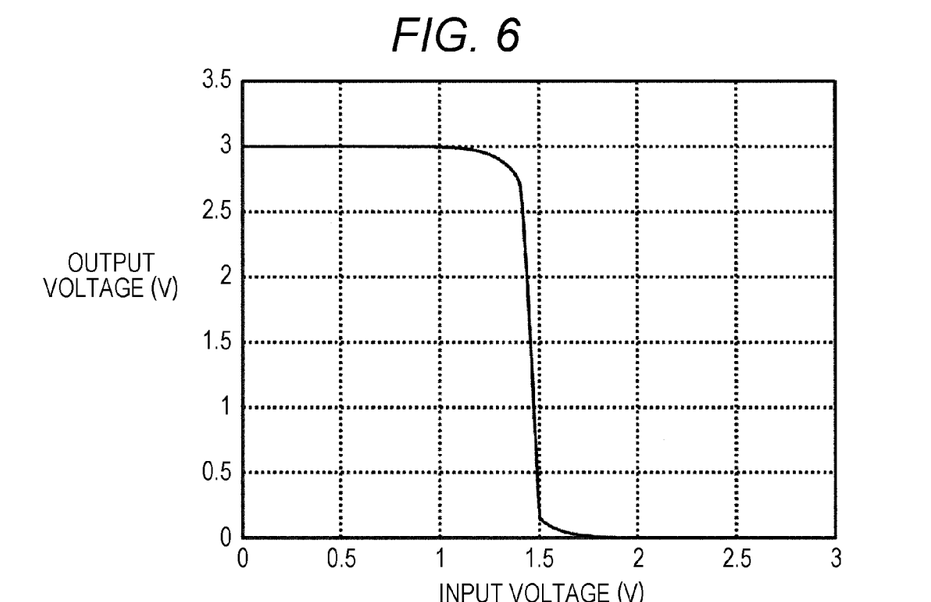
FIG. 6 is a graph illustrating a gate input voltage versus drain output voltage characteristic curve in a complementary nitride transistor according to the first exemplary embodiment of the present disclosure, in which a gate width of an n-channel transistor is 1 mm, and a gate width of a p-channel transistor is 4 mm.
Figure 7:
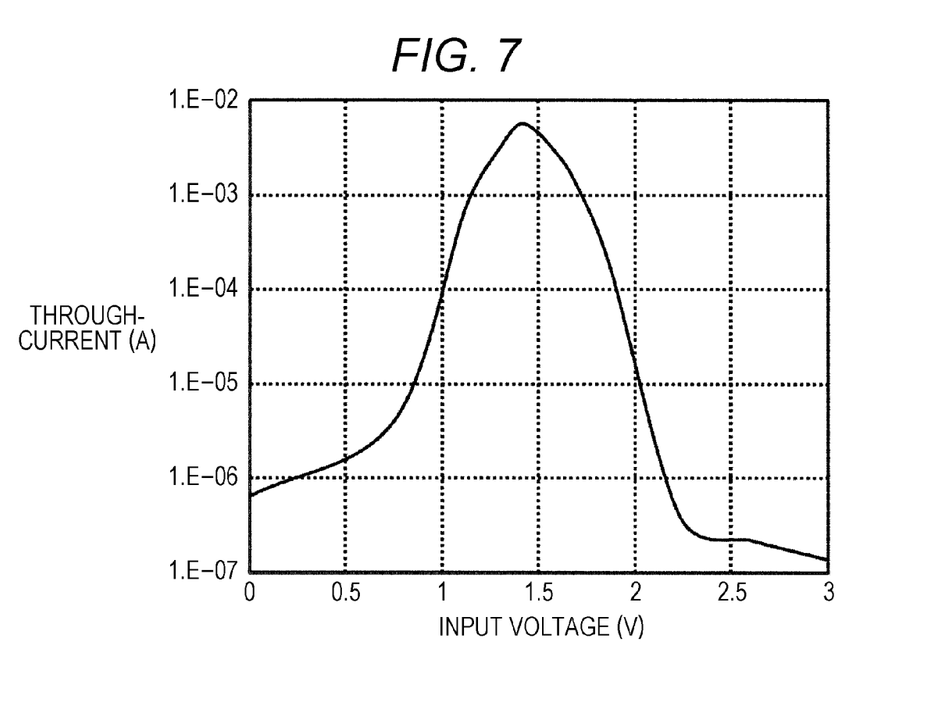
FIG. 7 is a graph illustrating a gate input voltage versus gate-source current characteristic curve in the complementary nitride transistor according to the first exemplary embodiment of the present disclosure, in which the gate width of the n-channel transistor is 1 mm, and the gate width of the p-channel transistor is 4 mm.

FIG. 6 illustrates a gate input voltage versus drain output voltage characteristic curve for a complementary nitride transistor that includes semiconductor device according to the present exemplary embodiment. FIG. 7 illustrates a gate input voltage versus gate-source current characteristic curve. FIG. 6 indicates that the complementary nitride transistor according to the present exemplary embodiment inverts the gate input voltage to make the drain output voltage. FIG. 7 indicates that, when a gate width of second nitride transistor 102 is 1 mm and a gate width of first nitride transistor 101 is 4 mm, a through-current during standby is equal to or less than the order of 1 μA, which is extremely smaller than a through-current of conventional transistors.

Thus, semiconductor device according to the present exemplary embodiment provides stable reference potential for the gate because first gate electrodes 27 and 28 and first substrate electrode 24 are disposed with depletion layer 17a between first gate electrodes 27 and 28 and first substrate electrode 24. This allows stabilization of an output of first nitride transistor 101. First substrate electrode 24, which is on fourth nitride semiconductor layer 18, can be provided without interference with a flow of current between first source electrode 25 and first drain electrode 26.

According to the semiconductor device of the present exemplary embodiment, the first nitride transistor includes part of the n-type first nitride semiconductor layer, part of the second nitride semiconductor layer, part of the p-type third nitride semiconductor layer, and part of the fourth nitride semiconductor layer. The first nitride semiconductor layer is located on a substrate side, the second nitride semiconductor layer is located on a first nitride semiconductor layer side, and the third nitride semiconductor layer is located on a fourth nitride semiconductor layer side. The first to fourth nitride semiconductor layers are disposed such that the second nitride semiconductor layer and the third nitride semiconductor layer are sandwiched between the first nitride semiconductor layer and the fourth nitride semiconductor layer. The third nitride semiconductor layer has the band gap that is narrower than the band gap of the second nitride semiconductor layer. Accordingly, the first nitride transistor includes the bottom-gate JFET structure using the heterojunction between the third nitride semiconductor layer and the second nitride semiconductor layer, using the first nitride semiconductor layer as the gate, and using the vicinity of the interface between the third nitride semiconductor layer and the second nitride semiconductor layer as the p-type channel. Therefore, it is possible to further include, on a common substrate, the second nitride transistor that has the top-gate JFET structure using the third nitride semiconductor layer as the gate, and using the vicinity of the interface between the second nitride semiconductor layer and the first nitride semiconductor layer as the n-type channel.

This allows the semiconductor device according to the present exemplary embodiment to form the complementary transistor. In addition, since the first nitride semiconductor layer and the third nitride semiconductor layer have the conductivity types opposite to each other, it is possible to operate both the first nitride transistor and the second nitride transistor in a normally-off state, and to constitute the complementary transistor that has the very small through-current during standby.

Second Exemplary Embodiment

Figure 8:
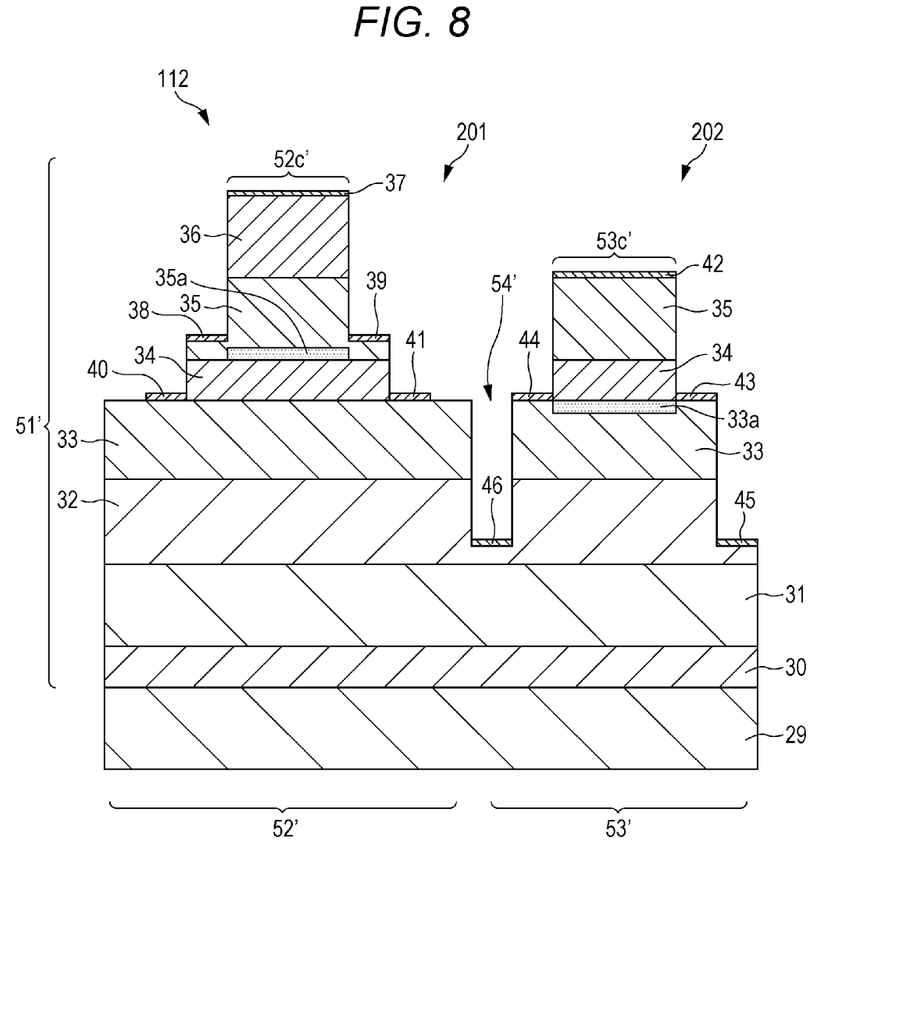
FIG. 8 is a cross-sectional view illustrating the semiconductor device according to a second exemplary embodiment of the present disclosure.

A second exemplary embodiment of a semiconductor device according to the present disclosure will be described below with reference to the drawings. FIG. 8 illustrates a schematic cross-sectional structure of semiconductor device 112 according to the second exemplary embodiment of the present disclosure. Semiconductor device 112 includes substrate 29, semiconductor multilayer structure 51' supported by substrate 29, first nitride transistor 201 provided in first area 52' of semiconductor multilayer structure 51', and second nitride transistor 202 provided in second area 53' different from first area 52'. Semiconductor device 112 according to the present exemplary embodiment differs from semiconductor device 111 according to the first exemplary embodiment in that a conductivity type of each semiconductor layer of semiconductor device 112 is opposite to a conductivity type of each semiconductor layer of semiconductor device 111.

Substrate 29 is formed of, for example, a silicon (Si) substrate having a plane direction (100) of a principal plane. Semiconductor multilayer structure 51' includes at least first nitride semiconductor layer 33, second nitride semiconductor layer 34, third nitride semiconductor layer 35, and fourth nitride semiconductor layer 36. In semiconductor multilayer structure 51', first nitride semiconductor layer 33 is located on a side nearest to substrate 29. Second nitride semiconductor layer 34 and third nitride semiconductor layer 35 are sandwiched and located between first nitride semiconductor layer 33 and fourth nitride semiconductor layer 36. Second nitride semiconductor layer 34 is located on a first nitride semiconductor layer 33 side. Third nitride semiconductor layer 35 is located on a fourth nitride semiconductor layer 36 side.

First nitride semiconductor layer 33 has a second conductivity type. For example, first nitride semiconductor layer 33 is a p-type GaN layer having a thickness of 200 nm, and having a concentration of activated magnesium (Mg), which is a p-type dopant, of $1\times10^{16}$ cm$^{-3}$.

Second nitride semiconductor layer 34 has no doped impurities, and has a band gap wider than a band gap of first nitride semiconductor layer 33. For example, second nitride semiconductor layer 34 is an $Al_{0.22}Ga_{0.78}N$ layer having no doped impurities, and having a thickness of 22 nm.

Third nitride semiconductor layer 35 has a first conductivity type. That is, third nitride semiconductor layer 35 has the conductivity type opposite to the conductivity type of first nitride semiconductor layer 33. In addition, third nitride semiconductor layer 35 has the band gap narrower than the band gap of second nitride semiconductor layer 34. For example, third nitride semiconductor layer 35 is an n-type GaN layer having a thickness of 200 nm, and having a concentration of activated silicon (Si), which is an n-type dopant, of $1\times10^{16}$ cm$^{-3}$.

Fourth nitride semiconductor layer 36 is a semi-insulating layer and has an electric resistance value larger than an electric resistance value of third nitride semiconductor layer 35. Fourth nitride semiconductor layer 36 is, for example, a GaN layer having doped carbon (C) of a concentration of $1\times10^{19}$ cm$^{-3}$, and having a thickness of 200 nm.

Semiconductor multilayer structure 51' may include another semiconductor layer in addition to the semiconductor layers described above. According to the present exemplary embodiment, semiconductor multilayer structure 51' further includes semi-insulating nitride semiconductor layer 32 located between substrate 29 and first nitride semiconductor layer 33, in order to secure electrical insulation between first nitride transistor 201 and second nitride transistor 202. Semi-insulating nitride semiconductor layer 32 is a GaN layer having doped carbon of a concentration of $1\times10^{19}$ cm$^{-3}$, and having a thickness of 200 nm. In addition, semiconductor multilayer structure 51' includes buffer layer 30 and superlattice layer 31 located between substrate 29 and semi-insulating nitride semiconductor layer 32. Buffer layer 30 is, for example, an AlN layer having no doped impurities and having a thickness of 50 nm. Superlattice layer 31 includes, for example, a plurality of GaN layers each having a thickness of 5 nm and a plurality of $Al_{0.05}Ga_{0.95}N$ layers each having a thickness of 5 nm, the GaN layers and $Al_{0.05}Ga_{0.95}N$ layers having no doped impurities and being alternately laminated. Superlattice layer 31 has a thickness of, for example, 3 µm. These semiconductor layers are, for example, laminated by epitaxial growth having a principal plane of a Ga plane.

As long as semiconductor multilayer structure 51' described above can be formed, a material and plane direction of substrate 29 are not limited to the exemplified material and plane direction. As long as the semiconductor layers above semi-insulating nitride semiconductor layer 32 can be laminated with good crystallinity, there is particularly no limitation on the material and thickness of buffer layer 30 and superlattice layer 31. Impurities for forming semi-insulating nitride semiconductor layers are not limited to carbon.

In order to electrically isolate first area 52' from second area 53' of semiconductor multilayer structure 51', element isolation structure 54' is provided in semiconductor multilayer structure 51'. According to the present exemplary embodiment, element isolation structure 54' is, for example, a mesa structure in which a recess is provided in semiconductor multilayer structure 51' so that the recess reaches semi-insulating nitride semiconductor layer 32 from a fourth nitride semiconductor layer 36 side. Element isolation may be performed by implantation of impurities or formation of oxidized layers.

First nitride transistor 201 includes, in first area 52' of semiconductor multilayer structure 51', part of first nitride semiconductor layer 33, part of second nitride semiconductor layer 34, part of third nitride semiconductor layer 35, and part of fourth nitride semiconductor layer 36. As will be described in detail below, first nitride transistor 201 is an n-channel heterojunction JFET. First nitride semiconductor layer 33 functions as a gate, and a vicinity of an interface between second nitride semiconductor layer 34 and third nitride semiconductor layer 35 functions as a channel. For this purpose, first nitride semiconductor layer 33 and third nitride semiconductor layer 35 are provided with electrodes.

Specifically, a ridge structure is formed in first area 52' in which side surfaces of the ridge structure sandwich main part 52c' including first nitride semiconductor layer 33, second nitride semiconductor layer 34, third nitride semiconductor layer 35, and fourth nitride semiconductor layer 36. Part of third nitride semiconductor layer 35 and part of first nitride semiconductor layer 33 are exposed on both sides of the ridge structure.

A pair of first gate electrodes 40 and 41 that sandwich the ridge structure are electrically connected to exposed surfaces of first nitride semiconductor layer 33. In addition, first source electrode 38 and first drain electrode 39 are electrically connected to exposed surfaces of third nitride semiconductor layer 35, the surfaces being spaced by a predetermined distance by the ridge structure. First substrate electrode 37 is further provided on a surface of fourth nitride semiconductor layer 36 that is a top of the ridge structure.

First substrate electrode 37, and first source electrode 38 and first drain electrode 39 each have a multilayer structure of Ti layer and Al layer. First gate electrodes 40 and 41 each have a Ni layer. Each of these electrodes has ohmic contact with the corresponding nitride semiconductor layer. Electrode materials described above are exemplary, and another electrode material may be used as long as a good ohmic characteristic is obtained.

Second nitride transistor 202 includes, in second area 53' of semiconductor multilayer structure 51', part of semi-insulating nitride semiconductor layer 32, part of first nitride semiconductor layer 33, part of second nitride semiconductor layer 34, and part of third nitride semiconductor layer 35. As will be described in detail below, second nitride transistor 202 is a p-channel heterojunction JFET. Third nitride semiconductor layer 35 functions as a gate, and a vicinity of an interface between second nitride semiconductor layer 34 and first nitride semiconductor layer 33 functions as a channel. For this purpose, first nitride semiconductor layer 33 and third nitride semiconductor layer 35 are provided with electrodes.

Specifically, a ridge structure is formed in second area 53' in which side surfaces of the ridge structure sandwich main part 53c' including semi-insulating nitride semiconductor layer 32, first nitride semiconductor layer 33, second nitride semiconductor layer 34, and third nitride semiconductor layer 35. Part of first nitride semiconductor layer 33 and part of semi-insulating nitride semiconductor layer 32 are exposed on both sides of the ridge structure. Fourth nitride semiconductor layer 36 is removed, and third nitride semiconductor layer 35 is exposed on a top of the ridge.

A pair of second substrate electrodes 45 and 46 that sandwich the ridge structure are electrically connected to exposed surfaces of semi-insulating nitride semiconductor layer 32. In addition, second source electrode 43 and second drain electrode 44 are electrically connected to exposed surfaces of first nitride semiconductor layer 33, the surfaces being spaced by a predetermined distance by the ridge structure. Second gate electrode 42 is further provided on a surface of third nitride semiconductor layer 35 that is a top of the ridge structure.

Second substrate electrodes 45 and 46, and second gate electrode 42 each have a multilayer structure of Ti layer and Al layer. Second gate electrode 43 and second drain electrode 44 each have a Ni layer. Each of these electrodes has ohmic contact with the corresponding nitride semiconductor layer. Electrode materials described above are exemplary, and another electrode material may be used as long as a good ohmic characteristic is obtained.

First gate electrodes 40 and 41 of first nitride transistor 201, and second gate electrode 42 of second nitride transistor 202 are electrically connected by unillustrated interconnection. First drain electrode 39 of first nitride transistor 201 and second drain electrode 44 of second nitride transistor 202 are electrically connected by unillustrated interconnection. First source electrode 38 and first substrate electrode 37 of first nitride transistor 201 are electrically connected by unillustrated interconnection. Second source electrode 43 and second substrate electrodes 45 and 46 of second nitride transistor 202 are electrically connected by unillustrated interconnection.

Next, an operation of semiconductor device 112 will be described.

In the logic inverter circuit as in the first exemplary embodiment, when no voltage is applied to any electrodes, depletion layer 35*a* is formed at an interface between third nitride semiconductor layer 35 and second nitride semiconductor layer 34, the interface serving as an n-type channel in first nitride transistor 201. Depletion layer 33*a* is formed at an interface between first nitride semiconductor layer 33 and second nitride semiconductor layer 34, the interface serving as a p-type channel in second nitride transistor 202. Therefore, first nitride transistor 201 and second nitride transistor 202, through which no current flows, are in a normally-off state.

Next, first source electrode 38 is grounded. A supply voltage, for example 3 V, is applied to second source electrode 43, the supply voltage being larger than an absolute value of a threshold voltage of first nitride transistor 201 and a threshold voltage of second nitride transistor 202. First gate electrodes 40 and 41, and second gate electrode 42 are grounded.

In this state, in first nitride transistor 201, a gate-source voltage becomes 0 V, the n-type channel is closed, and high resistance is obtained. Conversely, in second nitride transistor 202, the gate-source voltage becomes −3 V, the p-type channel is opened, and low resistance is obtained. This results in that potential becomes 3 V at an output terminal to which first drain electrode 39 and second drain electrode 44 are connected.

When 3 V, which is identical to the supply voltage, is applied to first gate electrodes 40 and 41 and second gate electrode 42, in first nitride transistor 201, the gate-source voltage becomes 3 V, the n-type channel is opened, and low resistance is obtained. Conversely, in second nitride transistor 202, the gate-source voltage becomes 0 V, the p-type channel is closed, and high resistance is obtained. This results in that the potential becomes 0 V at the output terminal to which first drain electrode 39 and second drain electrode 44 are connected. Thus, it is also possible to use semiconductor device 112 to constitute the complementary transistor. In addition, since first nitride semiconductor layer 33 and third nitride semiconductor layer 35 have the conductivity types opposite to each other, it is possible to operate both first nitride transistor 201 and second nitride transistor 202 in a normally-off state, and to constitute the complementary transistor that has a very small through-current during standby.

Third Exemplary Embodiment

Figure 10:
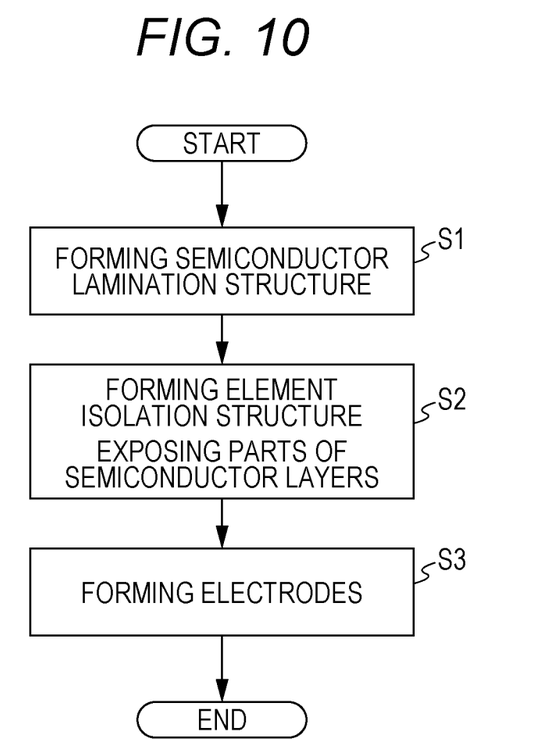
FIG. 10 is a flow chart illustrating a method of manufacturing the semiconductor device according to a third exemplary embodiment of the present disclosure.

A method of manufacturing semiconductor device 111 according to the first exemplary embodiment will be described below with reference to FIG. 1A and FIG. 10. Semiconductor device 112 according to the second exemplary embodiment can also be manufactured by a similar method.

First, semiconductor multilayer structure 51 is formed on substrate 11 by means of an epitaxial growth method such as MOCVD (Metal Organic Chemical Vapor Deposition) or MBE (Molecular Beam Epitaxy) (step S1). Semiconductor multilayer structure 51 includes at least first nitride semiconductor layer 15, second nitride semiconductor layer 16, third nitride semiconductor layer 17, and fourth nitride semiconductor layer 18. In semiconductor multilayer structure 51, first nitride semiconductor layer 15 is located on a side nearest to substrate 11. Second nitride semiconductor layer 16 and third nitride semiconductor layer 17 are sandwiched and located between first nitride semiconductor layer 15 and fourth nitride semiconductor layer 18. Second nitride semiconductor layer 16 is located on a first nitride semiconductor layer 15 side. Third nitride semiconductor layer 17 is located on a fourth nitride semiconductor layer 18 side.

Semiconductor multilayer structure 51 may further include semi-insulating nitride semiconductor layer 14, buffer layer 12, and superlattice layer 13 located between substrate 11 and first nitride semiconductor layer 15. Composition and impurity concentration of each semiconductor layer are as described in the first exemplary embodiment.

Next, element isolation structure 54 is formed for isolating first area 52 from second area 53, in semiconductor multilayer structure 51. In order to form electrodes, part of each semiconductor layer is exposed by dry etching or wet etching (step S2). When element isolation structure 54 is a mesa structure, a step of exposing part of each semiconductor layer and a step of forming element isolation structure 54 may be performed simultaneously.

Specifically, in first area 52, part of semiconductor multilayer structure 51 is removed by etching, and part of first nitride semiconductor layer 15 and two portions of third nitride semiconductor layer 17 are exposed, the two portions being spaced by a predetermined distance. In addition, in second area 53, part of semiconductor multilayer structure 51 is removed by etching, and part of semi-insulating nitride semiconductor layer 14, two portions of first nitride semiconductor layer 15, and part of third nitride semiconductor layer 17 are exposed, the two portions being spaced by a predetermined distance. These etching steps are performed, for example, through formation of a mask that uses a photolithographic technique generally used in semiconductor steps at a predetermined location on a surface of semiconductor multilayer structure 51 to etch semiconductor multilayer structure 51 using the mask. When element isolation structure 54 is a structure other than the mesa structure, element isolation structure 54 is formed by means of a step of implantation of impurities and of a step of forming an oxide in semiconductor multilayer structure 51, besides the above-mentioned etching step.

Next, each electrode is formed on the corresponding exposed semiconductor layer in first area 52 or second area 53 of semiconductor multilayer structure 51 (step S3). Specifically, the electrodes to be formed in first area 52 include first gate electrodes 27 and 28 each electrically connected to part of first nitride semiconductor layer 15, first substrate electrode 24 electrically connected to part of fourth nitride semiconductor layer 18, and first source electrode 25 and first drain electrode 26 electrically connected to two respective portions of third nitride semiconductor layer 17, the two portions being spaced by a predetermined distance. The electrodes to be formed in second area 53 include second substrate electrodes 22 and 23 each electrically connected to part of semi-insulating nitride semiconductor layer 14, second gate electrode 19 electrically connected to part of third nitride semiconductor layer 17, and second source electrode 20 and second drain electrode 21 electrically connected to two respective portions of first nitride semiconductor layer 15, the two portions being spaced by a predetermined distance. As described in the first exemplary embodiment, the electrodes formed in third nitride semiconductor layer 17, which is a p-type nitride semiconductor layer, include, for example, a Ni layer, and the electrodes formed in other semiconductor layers include, for example, a Ti layer and an Al layer. Accordingly, separate masks are used in a step of forming the Ni layer and in a step of forming the Ti layer and the Al layer. Annealing for forming ohmic contacts may be performed at one time after the formation of all the electrodes, and may be performed separately after the step of forming the Ni layer and after the step of forming the Ti layer and the Al layer. Thin films of these metals are formed using a thin film formation technique used for semiconductor manufacturing steps.

Semiconductor device 112 including first nitride transistor 101 and second nitride transistor 102 can be manufactured by these three steps.

Thus, according to the method of manufacturing the semiconductor device of the present exemplary embodiment, the semiconductor multilayer structure in which the first to fourth nitride semiconductor layers are disposed is formed on the substrate. Part of the first area of the semiconductor multilayer structure is removed by etching. Part of the first nitride semiconductor layer and two portions of the third nitride semiconductor layer are exposed, the two portions being spaced by a predetermined distance. The electrodes to be formed include the first gate electrodes each electrically connected to part of the first nitride semiconductor layer, the first substrate electrode electrically connected to part of the fourth nitride semiconductor layer, and the first source electrode and first drain electrode electrically connected to two respective portions of the third nitride semiconductor layer, the two portions being spaced by a predetermined distance. This allows manufacturing of the semiconductor device including the first nitride transistor that has the bottom-gate JFET structure using the heterojunction between the third nitride semiconductor layer and the second nitride semiconductor layer, using the first nitride semiconductor layer as the gate, and using the vicinity of the interface between the third nitride semiconductor layer and the second nitride semiconductor layer as the p-type channel. Therefore, simultaneously with the step of manufacturing the first nitride transistor, it is possible to further manufacture, on the common substrate, the second nitride transistor that has the top-gate JFET structure using the third nitride semiconductor layer as the gate, and using the vicinity of the interface between the first nitride semiconductor layer and the second nitride semiconductor layer as the n-type channel.

Thus, the manufacturing method according to the present exemplary embodiment allows manufacturing of the semiconductor device that includes the first nitride transistor and second nitride transistor capable of constituting the complementary transistor. Since the first nitride semiconductor layer and the third nitride semiconductor layer have the conductivity types opposite to each other, both the first nitride transistor and second nitride transistor can operate in a normally-off state, and the complementary transistor can be constituted having a very small through-current during standby.

The semiconductor device disclosed herein can be used in, for example, high-speed, low-power-consumption gate voltage control of a power transistor.

What is claimed is:

1. A semiconductor device comprising:
   a substrate;
   a semiconductor multilayer structure supported by the substrate;
   a first nitride transistor provided in a first area of the semiconductor multilayer structure; and
   a second nitride transistor provided in a second area different from the first area in the semiconductor multilayer structure, wherein:
   the semiconductor multilayer structure comprises:
      a first nitride semiconductor layer;
      a second nitride semiconductor layer;
      a third nitride semiconductor layer having a band gap narrower than a band gap of the second nitride semiconductor layer;
      a fourth nitride semiconductor layer having an electric resistance value larger than an electric resistance value of the third nitride semiconductor layer, and
      a semi-insulating nitride semiconductor layer located between the substrate and the first nitride semiconductor layer,
   the first nitride semiconductor layer is located between the substrate and the second nitride semiconductor layer,
   the third nitride semiconductor layer is located between the second nitride semiconductor layer and the fourth nitride semiconductor layer,
   the second nitride semiconductor layer and the third nitride semiconductor layer are located between the first nitride semiconductor layer and the fourth nitride semiconductor layer,
   the first nitride transistor comprises:
      part of the first nitride semiconductor layer, part of the second nitride semiconductor layer, part of the third nitride semiconductor layer, and part of the fourth nitride semiconductor layer, the parts of the first to fourth semiconductor layers being located in the first area of the semiconductor multilayer structure;
      a first gate electrode electrically connected to the part of the first nitride semiconductor layer;
      a first source electrode electrically connected to one of two portions in the third nitride semiconductor layer, and a first drain electrode electrically connected to the other one of the two portions in the third nitride semiconductor layer, the two portions being spaced by a predetermined distance; and
      a first substrate electrode electrically connected to the part of the fourth nitride semiconductor layer, the second nitride transistor comprising:
- part of the first nitride semiconductor layer, part of the second nitride semiconductor layer, part of the third nitride semiconductor layer, and part of the semi-insulating nitride semiconductor layer, the parts of the first to third nitride semiconductor layers being located in the second area of the semiconductor multilayer structure;
- a second substrate electrode electrically connected to the part of the semi-insulating nitride semiconductor layer;
- a second source electrode electrically connected to one of two portions in the first nitride semiconductor layer, and a second drain electrode electrically connected to the other one of the two portions in the first nitride semiconductor layer, the two portions being spaced by a predetermined distance; and
- a second gate electrode electrically connected to the part of the third nitride semiconductor layer, and the second nitride semiconductor layer has the band gap wider than a band gap of the first nitride semiconductor layer.

2. The semiconductor device according to claim 1, wherein
the first nitride semiconductor layer has an electric resistance value smaller than an electric resistance value of the semi-insulating nitride semiconductor layer.

3. The semiconductor device according to claim 1, further comprising an element isolation structure configured to isolate the first area from the second area in the semiconductor multilayer structure.

4. The semiconductor device according to claim 1, wherein the first nitride semiconductor layer and the third nitride semiconductor layer have conductivity types opposite to each other.

5. The semiconductor device according to claim 1, wherein
an interface between the first nitride semiconductor layer and the second nitride semiconductor layer, and an interface between the second nitride semiconductor layer and the third nitride semiconductor layer are each depleted, when no voltage is applied to the first and second gate electrodes in the first nitride transistor and the second nitride transistor.

* * * * *